(12) United States Patent
Tashiro et al.

(10) Patent No.: US 9,245,785 B2
(45) Date of Patent: Jan. 26, 2016

(54) SUBSTRATE PROCESSING APPARATUS

(75) Inventors: Yukihito Tashiro, Tokyo (JP);
Toshikazu Nakazawa, Saitama (JP)

(73) Assignee: Canon Anelva Corporation,
Kawasaki-shi (JP)

( * ) Notice: Subject to any disclaimer, the term of this patent is extended or adjusted under 35 U.S.C. 154(b) by 105 days.

(21) Appl. No.: 13/344,663

(22) Filed: Jan. 6, 2012

(65) Prior Publication Data

US 2012/0148375 A1 Jun. 14, 2012

Related U.S. Application Data

(63) Continuation of application No. PCT/JP2010/061766, filed on Jul. 12, 2010.

(30) Foreign Application Priority Data

Jul. 14, 2009 (JP) ................................. 2009-165876

(51) Int. Cl.
  *H01L 21/677* (2006.01)
  *H01L 21/67* (2006.01)

(52) U.S. Cl.
  CPC ...... *H01L 21/67748* (2013.01); *H01L 21/6719* (2013.01); *H01L 21/67173* (2013.01); *H01L 21/67184* (2013.01); *H01L 21/67196* (2013.01)

(58) Field of Classification Search
  CPC .............................................. H01L 21/67739
  USPC .................................................. 414/217, 939
  See application file for complete search history.

(56) References Cited

U.S. PATENT DOCUMENTS 7,695,233 B2   4/2010  Toshima
2005/0232727 A1* 10/2005 Ferrara ......................... 414/217
(Continued)

FOREIGN PATENT DOCUMENTS

CN   100437898 C   11/2008
JP   61-112032 A    5/1986
(Continued)

OTHER PUBLICATIONS

English translation of the Written Opinion of the International Searching Authority, issued in PCT/JP2010/061766, dated Aug. 10, 2010 (5 pages).

(Continued)

*Primary Examiner* — Saul Rodriguez
*Assistant Examiner* — Willie Berry, Jr.
(74) *Attorney, Agent, or Firm* — Fitzpatrick, Cella, Harper & Scinto

(57) ABSTRACT

The present invention provides an in-line type multi-chamber substrate processing apparatus which, with a simple configuration, can decrease influence of particles due to film peeling and enables installation of a number of processing chambers. In one embodiment of the present invention, a jointless arm of a transfer robot that has a substrate holding part 4a and performs rotational movement while maintaining a predetermined length of the arm is disposed inside a first process chamber capable of being evacuated. The first process chamber is configured to be able to transfer substrates from an adjacent second process chamber through an opening by the arm of the transfer robot. A holder as an arm retreating position and a substrate mounting position is positioned so as to overlap with a trajectory of the substrate holding part when the arm of the transfer robot rotates about a rotation axis.

3 Claims, 13 Drawing Sheets

(56) References Cited

U.S. PATENT DOCUMENTS

| | | |
|---|---|---|
| 2006/0182532 A1 | 8/2006 | Okada et al. |
| 2008/0206021 A1* | 8/2008 | Smith et al. ................ 414/217 |
| 2011/0155059 A1 | 6/2011 | Egami et al. |

FOREIGN PATENT DOCUMENTS

| | | |
|---|---|---|
| JP | 61-112312 A | 5/1986 |
| JP | 63-18841 U | 2/1988 |
| JP | 2-110047 A | 4/1990 |
| JP | 5-330647 A | 12/1993 |
| JP | 10-30183 A | 2/1998 |
| JP | 2001-319852 A | 11/2001 |
| JP | 2005-289556 A | 10/2005 |
| JP | 2006-156762 A | 6/2006 |
| JP | 2007-242648 A | 9/2007 |

OTHER PUBLICATIONS

English translation of the International Preliminary Report on Patentability, issued in PCT/JP2010/061766, dated Feb. 7, 2012 (6 pages).

Office Action (Notification of Refusal Reason) in Japanese Patent Application No. 2011-522802, mailed Mar. 4, 2014 (3 pgs.).

Office Action issued in CN 201080032021.1 on Jul. 25, 2014 (4 pages).

* cited by examiner

SUBSTRATE PROCESSING APPARATUS

CROSS-REFERENCES TO RELATED APPLICATIONS

This application is a continuation application of International Application No. PCT/JP2010/061766, filed Jul. 12, 2010, which claims the benefit of Japanese Patent Application No. 2009-165876, filed Jul. 14, 2009. The contents of the aforementioned applications are incorporated herein by reference in their entities.

TECHNICAL FIELD

The present invention relates to a substrate processing apparatus for applying predetermined processing on a substrate surface.

BACKGROUND ART

A substrate processing apparatus for performing predetermined processing on a substrate is known as thin film deposition apparatus such as sputtering apparatus and chemical vapor deposition (CVD) apparatus, etching apparatus, surface oxidation apparatus, surface nitridation apparatus, and the like. These substrate processing apparatus comprising an airtight processing chamber in order to process substrates in a predetermined atmosphere. Further, the substrate processing apparatus has often a plurality of processing chambers from the purpose of continuously performing different processing, and increasing productivity. In this description, these substrate processing apparatus having a plurality of processing chambers (process rooms) are collectively referred to as multi-chamber substrate processing apparatus.

One typical type of multi-chamber apparatus is a cluster tool type shown in FIG. 14. This type is configured to circumferentially couple a plurality of vacuum processing chambers 13a, 13b, 13c and a load lock chamber 10 in an airtight condition to a transfer chamber 11 including a robot for transferring substrates (hereinafter refer to as a transfer robot).

After the load lock chamber 10 is evacuated from atmosphere to vacuum, a substrate (not shown) is transferred to the vacuum processing chamber 13a by a transfer robot 12 in the transfer chamber 11. After being processed in the vacuum processing chamber 13a, substrates (not shown) are transferred to a vacuum processing chamber 13b by the transfer robot 12 in the transfer chamber 11. After being processed in the vacuum processing chamber 13b, substrates (not shown) are transferred to the vacuum processing chamber 13c by the transfer robot 12 in the transfer chamber 11. After being processed in the vacuum processing chamber 13c, substrates (not shown) are carried out and return to the load lock chamber 10.

A cluster tool type multi-chamber substrate processing apparatus may have merits of providing a relatively large number of processing chambers with relatively small occupied area. In the above described substrate processing apparatus, a need has arisen for providing more processing chambers with increased complexity and integration in entire processing, request for improvement of productivity and the like as a background.

For example, as processes to be continuously performed under vacuum increase, a number of processing chambers may also be required to be increased accordingly. As the same processes are performed in parallel for improving productivity, more chambers may also be required.

To increase the number of processing chambers in the cluster tool type apparatus, a circumferential length of a central transfer chamber (reference numeral 11 shown in FIG. 14) increases. This increases the size of the transfer chamber, and results in a large operating range of the transfer robot. The large size of the transfer chamber makes an evacuating time longer. Meanwhile, the large operating range of the transfer chamber requires a larger size transfer robot, which causes a problem that the apparatus becomes mechanically complex.

As disclosed in the patent document 1, a mechanism for transferring substrates by an in-line system is considered for avoiding above described problem.

Patent document 1: Japanese Patent Application Laid-Open No. 2005-289556

SUMMARY OF INVENTION

However, in conventional in-line type multi-chamber substrate processing apparatus, transfer with a substrate mounted on a substrate tray is generally performed when the substrate is transferred between processing chambers. In each of the processing chambers performing predetermined processing, the substrate tray as a substrate transfer member also exists together with the substrate in the processing chamber while mounting the substrate. Therefore, for example, in a film formation process and the like, particles due to film peeling from the film formed on the substrate may be generated and particles may adhere on the substrate tray. Accordingly, there has been required a countermeasure against particles due to peeling of a film adhering on the substrate tray in the conventional apparatus.

The present invention has been made in order to solve these problems, and has an object to provide an in-line type multi-chamber substrate processing apparatus which, with a simple configuration, can decrease influence of particles due to film peeling and enables installation of a number of processing chambers.

To achieve above described object, the present invention provides a substrate processing apparatus having at least two chambers, comprising: a first chamber including a transfer robot having an arm that includes a substrate holding part capable of holding a substrate, extends in a direction vertical to a rotation axis and is rotatable about the rotation axis while maintaining a length of the arm, a first position for positioning the substrate when performing predetermined processing on the substrate and when transferring the substrate to an adjacent chamber, a second position different from the first position, and a first opening; and a second chamber provided adjacent to the first chamber on an upstream side of the substrate processing apparatus in a direction in which the substrate is transferred, the second chamber including a third position for positioning the substrate when transferring the substrate to the first chamber, and a second opening, wherein the first opening and the second opening are provided so that the substrate is transferred from the second chamber to the first chamber through the first opening and the second opening, wherein the first position, the second position, the third position, the first opening, and the second opening are positioned respectively so that the first position, the second position, the third position, the first opening, and the second opening overlap with a trajectory of the substrate holding part when the arm rotates about the rotation axis; and wherein the transfer robot is configured to rotate the arm so that the substrate holding part is located on the second position when the predetermined processing is performed on the substrate in the first chamber, and when the substrate is transferred from the second chamber to the first chamber, the substrate holding part enters the second chamber through the first opening and the second opening to be located on the third position.

In accordance with the substrate processing apparatus of the present invention, a tray for transferring substrates used for conventional in-line type multi-chamber type substrate processing apparatus is not required. In accordance with the present invention, the transfer robot that performs rotational movement for moving the substrate horizontally while maintaining a predetermined arm length is mounted on each chamber of the substrate processing apparatus (e.g. an evacuable vacuum room, etc.). Accordingly, the transfer robot does not perform a complex movement of expanding and contracting its joint. Further, when substrates are transferred between tandem chambers, an operating position is located on the rotational trajectory of the substrate holding part of the arm. Therefore, substrates can be transferred with decreased film peeling of thin film that may adhere to the transfer robot by means of simple configuration.

DESCRIPTION OF EMBODIMENTS

Figure 1:
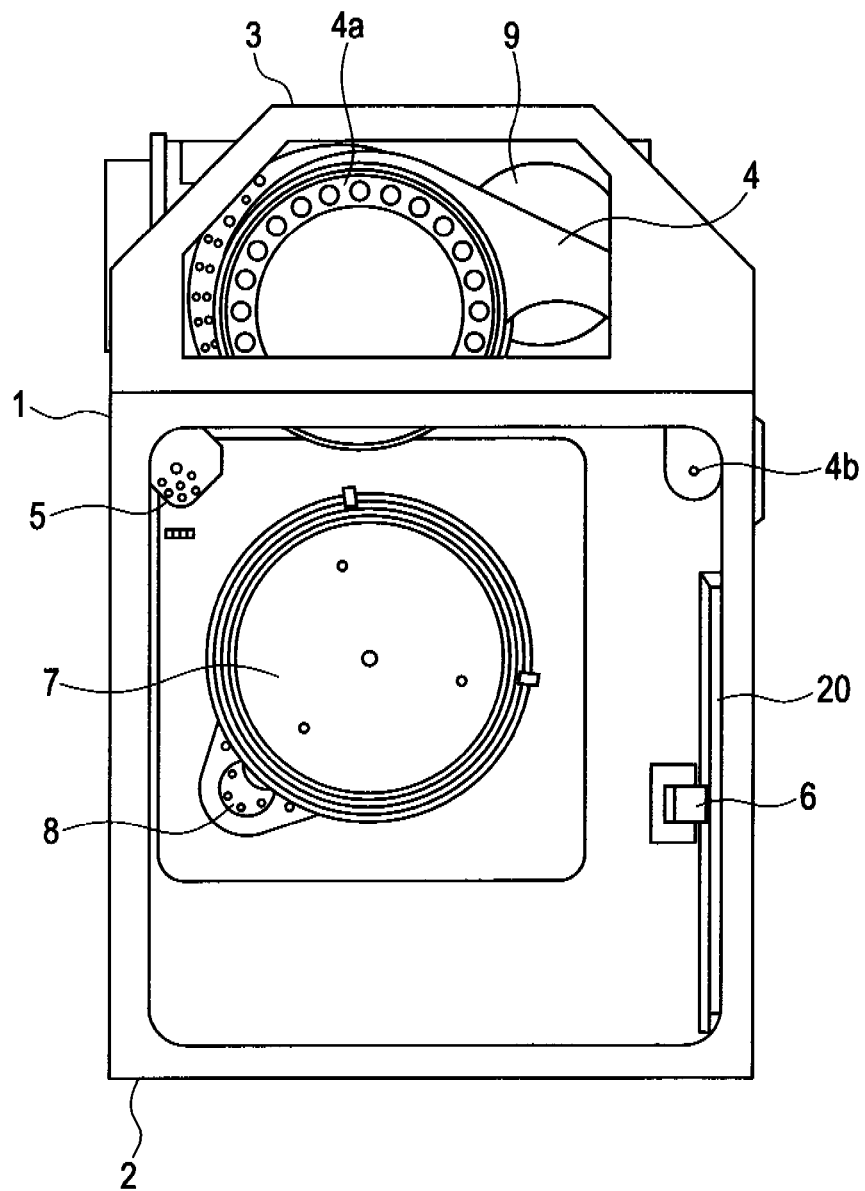
FIG. 1 is a schematic plan view of a substrate processing apparatus in an embodiment of the present invention.

Explanation of embodiments of the present invention will be given below with reference to drawings, but the present invention is not limited to the embodiments. In the following drawings, the same reference numeral indicates an element having the same function and may not be described repeatedly.

In accordance with one embodiment of the present invention, an in-line type substrate processing apparatus includes at least two chambers such as an evacuable vacuum room (e.g. a process room capable of performing predetermined processing on substrates), wherein each of at least two of these chambers adjacent to each other includes a transfer robot having an arm in which a substrate holding part capable of holding the substrate is formed. The transfer robot is configured so that the arm is rotatable about a predetermined position (a rotation axis as a rotation center) in the chamber. That is, the transfer robot is configured so that the arm configured to extend in a direction vertical to the rotation axis performs rotational movement in a plane vertical to the rotation axis. Therefore, the substrate holding part that is formed on the arm is also rotated about the rotation axis by the rotational movement. Further, the transfer robot is configured to perform the rotational movement with an arm length to be maintained.

In the following, the process room used as the chamber will be described.

In this description, a length from the rotation center of the transfer robot to a farthermost point from the rotation center of the substrate holding part is called the arm length.

The process room including the transfer robot has therein a first position for positioning the substrate when performing the predetermined processing on it and when transferring it to other process room, and a second position different from the first position. The transfer robot can operate so that the substrate holding part stops on the first and second positions and moves between the first and second positions as desired. That is, the transfer robot can operate so that the substrate holding part is retreated at the second position when the predetermined processing is performed in the process room, and the substrate holding part is located at the first position when the substrate is transferred.

The second position may be a position located near a vacuum evacuation port.

Here, the rotation axis, the first position, and the second position are positioned so that the first position and the second position are located on an arc with a line segment as a radius which connects the rotation axis and a predetermined point (e.g. the center of a substrate holding surface) in the substrate holding surface of the substrate holding part and with the rotation axis as a center. That is, the rotation axis, the first position, and the second position are positioned so that both the first position and the second position overlap with a trajectory (locus) of the substrate holding part when the arm rotates about the rotation axis.

Further, there are provided openings in the two adjacent process rooms, respectively. The two adjacent process rooms are located in tandem such that the substrate can move between the two rooms through the openings. That is, the two adjacent process rooms are located so as to share the openings each other. In addition, the transfer robot in the process room on the downstream side (downstream process room) in a direction in which the substrate is transferred in the in-line system is configured to be able enter the process room on the upstream side (upstream process room) through the openings.

In accordance with one embodiment of the present invention, the upstream room has the position corresponding to the first position (that is often called "the third position" seen from the downstream process room, in order to distinguish from a first position of the downstream process room). The rotation of the transfer robot in the downstream process room can position the substrate holding part of the transfer robot in the downstream process room onto the third position in the upstream process room. That is, the downstream and upstream process rooms are configured so that both the first and second positions in the downstream process room and the third position in the upstream process room (seen from the downstream process room) overlap with a trajectory of the substrate holding part when the substrate holding part (arm) in the downstream process room rotates about the rotation center.

Accordingly, when the substrate is transferred from the upstream process room to the downstream process room, the transfer robot in the downstream process room can position the substrate that has processed in the upstream process room onto the transfer robot included in the downstream process room by rotating the arm in the downstream process room so that the substrate holding part in the downstream process room enters the upstream process room through the openings of the upstream process room and the downstream process room and is located on the third position.

The upstream process room can have the same transfer robot as that in the downstream process room, and the position corresponding to the second position (that may be called "the fourth position" seen from the downstream process room in order to be distinguished from the second position in the downstream process room). At this time, it is obvious that the third and fourth positions are positioned so as to overlap with the trajectory of the substrate holding part formed on the arm when the arm of the transfer robot included in the upstream process room rotates about the rotation axis of the arm.

In accordance with one embodiment of the present invention, as described above, since the second position is provided separately to the first position where the substrate is located during being processed and transferred, the transfer robot can be retreated to the position where the vacuum evacuation port is provided in the vicinity thereof, different from the substrate being processed during the predetermined processing.

Accordingly, in accordance with one embodiment of the present invention, the second position is an arm retreat position and the first position is a substrate mounting position and a substrate transfer position.

Here, arm operating positions of the transfer robot will be described below, respectively. First, the arm retreat position as the second position is a retreat position of the transfer robot to avoid a film adhesion to the transfer robot due to processing performed on the substrate, corrosion and the like, when processing such as film formation or etching is performed on the substrate in the process room of the substrate processing apparatus. That is, the arm retreat position is the position to retreat the transfer robot at lease during processing and differs from the position where the substrate is disposed during processing (a substrate holder etc.). The vacuum evacuation port may be provided near the second position. In this case, the second position is the position at which the vacuum evacuation port is provided in the vicinity thereof to retreat the transfer robot at lease during processing.

Next, the substrate mounting position as the first position is the position of the substrate when the processing is performed on the substrate in the process room, that is, the position on the holder in the process room where the transfer robot is disposed.

Last, the substrate transfer position as the third position seen from the transfer robot disposed in the downstream process room is, for example, the position where the substrate is disposed in the upstream process room when the transfer robot in the downstream process room transfers the substrate on the holder in the adjacent next downstream process room (the substrate mounting position) after completing the predetermined processing on the substrate in the upstream process room disposed on the upstream side thereof. Accordingly, the substrate transfer position in the process room seen from the downstream side is the substrate mounting position in the process room seen from the upstream side for the adjacent process room.

Thus, in accordance with one embodiment of the present invention, the first position in the downstream process room (the substrate mounting position and the substrate transfer position), the second position in the downstream process room (the arm retreat position) in the downstream process room, and the third position in the upstream process room (the substrate transfer position) are provided on the trajectory of the substrate holding part of the transfer robot in the downstream process room in a state that the arm length does not change. Therefore, the substrate at the substrate transfer position in the upstream process room can be transferred to the substrate mounting position in the downstream process room by merely rotating the arm in the downstream process room, and the transfer robot in the downstream process room can be retreated to the position where the vacuum evacuation port is provided in the vicinity thereof separately from the substrate being processed during the processing on the substrate. Accordingly, for example, even if the film formed on the substrate in a film formation process is peeled off, adhesion of particles to the transfer robot due to film peeling can be reduced. Further, adhesion of an etching gas and an etchant to the transfer robot in the etching process, for example, can be reduced as well; therefore the corrosion of the transfer robot can be also reduced.

Thus, in accordance with one embodiment of the present invention, the substrate transfer from the upstream process room to the downstream process room can be achieved by means of simplified mechanism, while, the influence due to the processing in the upstream process room during processing on substrates in the downstream process room may become less susceptible.

In accordance with one embodiment of the present invention, the arm of the transfer robot may have both joint and jointless mechanisms. As described above, in accordance with one embodiment of the present invention, considering that the first and second positions are provided on the trajectory of the substrate holding part without causing complexity of the apparatus, it is preferable that the arm (the substrate holding part) is rotated by the transfer robot while keeping the length of the arm. Therefore, the arm of the transfer robot may have the jointless mechanism as well as the joint mechanism, and if the arm has the jointless mechanism, the configuration of the transfer robot can be simplified; therefore it is further preferable to use the jointless arm.

The configuration of the process room as an example of a chamber in the substrate processing apparatus in accordance with one embodiment of the present invention is not limited and can be arbitrarily selected corresponding to processing contents, and the chamber, for example, may be allowed to include a function of only transferring substrates.

For example, when a sputtering process is performed in the process room, a (substrate) holder for mounting and holding the substrate on its upper surface and a target disposed so as to face the holder are provided in the process room. Then, the vacuum evacuation port for evacuating the process room and a gas introduction system for introducing process gases into the process room are provided.

A magnet unit for achieving a magnetron discharge is disposed behind the target. Process gases such as argon are introduced, and sputtering discharge is generated by applying a negative high voltage or a direct-current voltage to the target. A material sputtered from the target by sputtering reaches the substrate and a predetermined thin film is formed on the surface of the substrate.

In the case where the thin film is formed by chemical vapor deposition (CVD) in the process room, the (substrate) holder and a electrode for generating plasma are provided in the process room. There is provided the vacuum evacuation port for evacuating the process room, the gas introduction system for introducing process gases into the process room, and a high-frequency power supply for generating high-frequency discharge by applying a high-frequency voltage to the electrode. Vapor phase reaction is caused in the plasma generated by the high-frequency discharge to form a thin film on the surface of the substrate.

Furthermore, when plasma etching is performed in the process room, with a configuration almost the same as that of the CVD, the apparatus is configured to introduce gas having etching effects, for example, fluorine-based gas in the process room. The surface of the substrate is etched by means of the action of fluorine-activated species generated in the plasma.

The arm of the transfer robot for transferring substrates is configured to be provided with the jointless mechanism for heat sources such as the holder and the heated substrate, in consideration of a transfer system trouble due to heat, and contamination in vacuum due to grease and the like.

The substrate processing apparatus and its operation in accordance with one embodiment of the present invention will be described bellow.

FIG. 1 shows a schematic plan view of a process room 1 provided in the substrate processing apparatus 2 in accordance with one embodiment of the present invention. For the purpose of this description, the process room 1 is hereinafter referred to as a first process room 1. Any other configurations described above may be adopted to the required configuration as the process room.

The first process room 1 is communicated with an evacuation room 3 including the vacuum evacuation port 9. In the first process room 1, there is provided an arm 4 of the transfer robot for transferring substrates (not shown), an arm 5 for a shutter, a gate valve 6 opening and closing at an opening 20 shared with the adjacent second process room (not shown), a holder 7 for mounting the substrate (not shown), a pin (not shown) for supporting the substrate (not shown) on the holder 7 at the time of delivering the substrate (not shown), and a substrate lifting mechanism 8 for moving up and down the pin. A substrate holding part 4a is formed on the arm 4 of the transfer robot and the arm 4 is configured to be capable of rotational movement about a rotation axis 4b as a rotation center.

In the present embodiment, a second position (arm retreat position) is provided in the evacuation room 3 and the holder 7 is a first position (this position is a substrate mounting position for the first process room 1 and is the substrate transfer position for the process room located on the downstream side of the first process room 1).

The arm retreat position and the position of the holder 7 are positioned so as to overlap with a trajectory of the substrate holding part 4a when the arm 4 of the transfer robot rotates about the rotation axis 4b. The opening 20 is also positioned on the trajectory of the substrate holding part 4a because of the need to cause the substrate holding part 4a of the transfer robot to enter the process room (the upstream process room) provided on the side of the opening 20. Accordingly, the substrate holding part 4a at the arm retreat position can be disposed on the holder 7 by merely rotating the arm 4 of the transfer robot about the rotation axis 4b, and substrates can be transferred between the upstream process room and the first process room.

Figure 2:
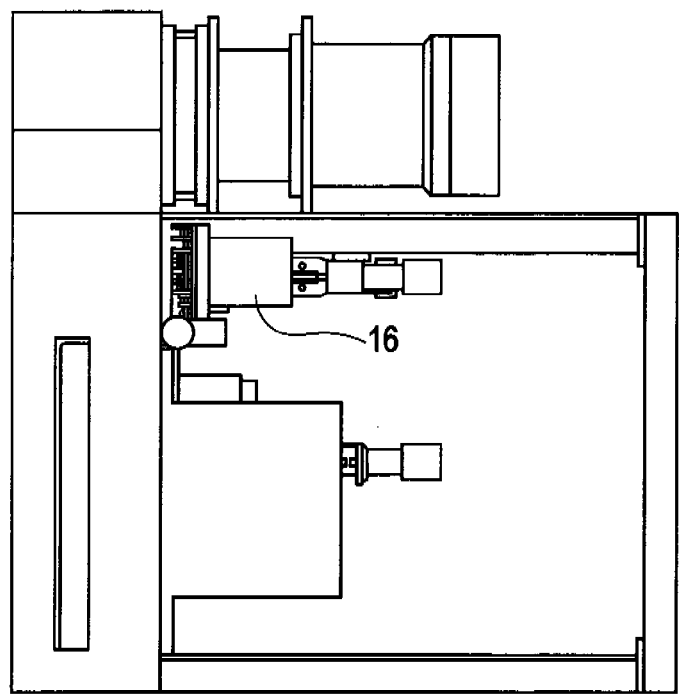
FIG. 2 is a schematic side view of the substrate processing apparatus in an embodiment of the present invention.

FIG. 2 shows a schematic side view of the process room 1 constituting the substrate processing apparatus 2 shown in FIG. 1. A drive part 16 of the arm (shown in FIG. 1, reference numeral 4) of the transfer robot for transferring the substrate (not shown) is provided with a rotation mechanism for moving substrates horizontally in a plane parallel to the holder (shown in FIG. 1, reference numeral 7) with the rotation axis of the driver part as a center (corresponding to the rotation axis 4b), and an adjustment mechanism for adjusting a shift amount of the holder of the adjacent second process room (not shown) from the center position due to an erection tolerance. The displacement of the substrate can be corrected by detecting the shift of the substrate during transferring by means of sensor (not shown) or CCD (not shown). This rotation mechanism, adjustment mechanism, detection mechanism, and the like including connections between each of the process rooms are electrically connected and are controlled by a control system (not shown).

Fig. XA (X: 3-12) out of the figures from FIG. 3A to FIG. 12B is a schematic perspective view indicating a transferring state by means of the substrate processing apparatus 2 in accordance with the present embodiment. Fig. XB (X: 3-12) out of the figures from FIG. 3A to FIG. 12B shows a schematic side view of the Fig. XA (X: 3-12). Fig. XA (X: 3-12) and Fig. XB (X: 3-12) show the configuration that the second process room 15 is adjacent to the first process room 1 provided in the substrate processing apparatus 2 through the opening (not shown) where the gate valve 6 opens and closes. Furthermore in FIG. 3A-FIG. 12B, substrates processed in the second process room 15 are transferred to the first process room 1, and therefore, the transferring direction of substrates in the in-line system is oriented in the direction from the second process room 15 to the first process room 1 and the first process room 1 becomes the downstream process room and the second process room 15 becomes the upstream process room.

Figure 3A:
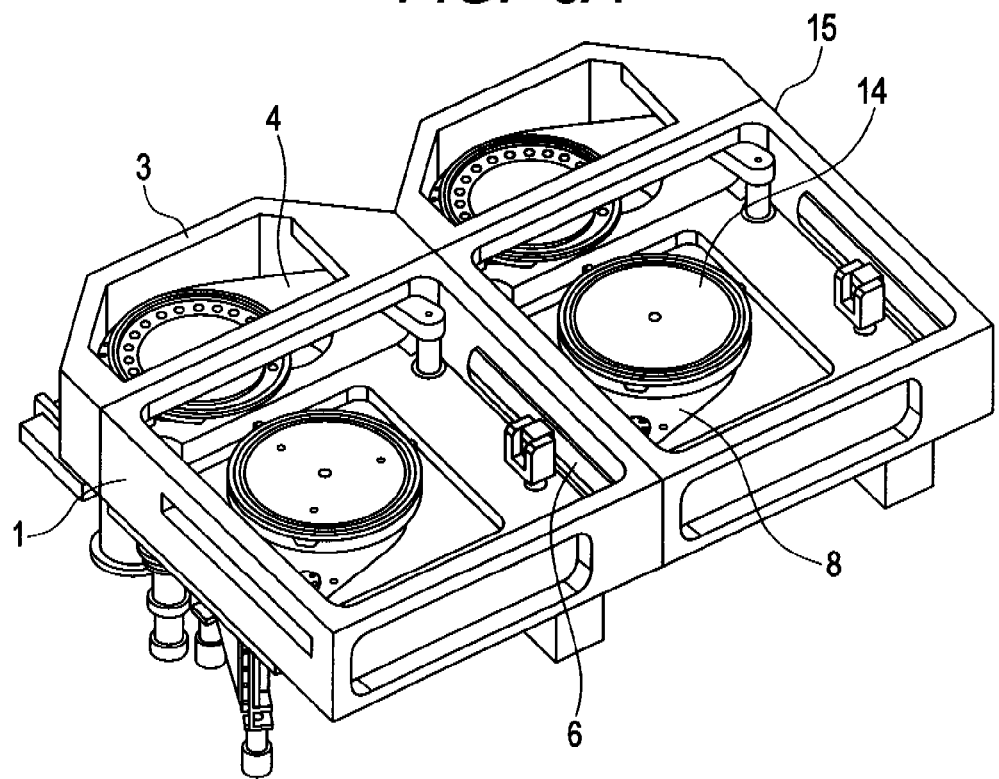
FIG. 3A is a schematic perspective view indicating a transferring state of the substrate by the substrate processing apparatus in an embodiment of the present invention.
Figure 3B:
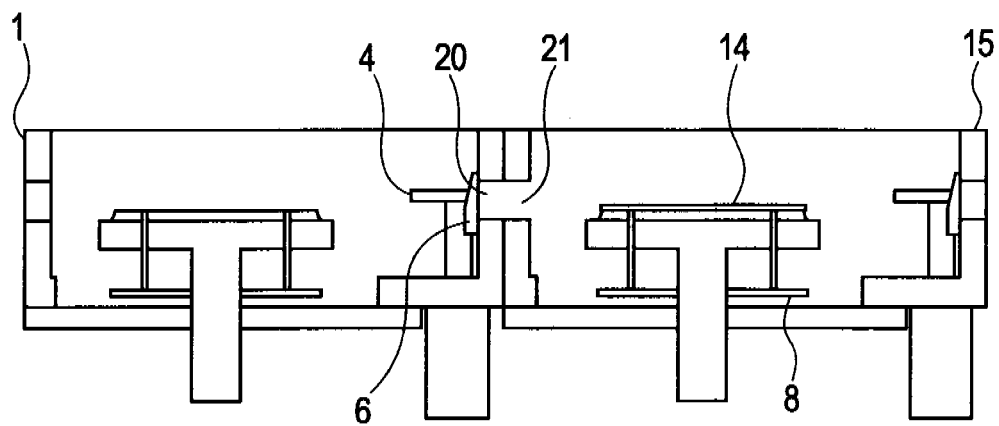
FIG. 3B is a schematic side view in FIG. 3A indicating the transferring state of the substrate by the substrate processing apparatus in an embodiment of the present invention.

As shown in FIG. 3B, the opening of the first process room 1 is disposed so as to overlap with an opening 21 of the second process room and the substrate holding part 4a of the arm 4 of the transfer robot in the first process room 1 can be disposed so as to overlap with the holder 7 (the third position) of the second process room 15 by moving the substrate holding part 4a of the arm 4 of the transfer robot in the first process room 1 into the second process room 15 through openings 20 and 21 by rotating the arm 4 of the transfer robot in the first process room 1 about the rotation axis 4b by means of the drive of the drive part 16. Accordingly, in the present embodiment, the arm retreat position, the position of holder 7, and the position of the opening 20 in the fist process room 1 as well as the arm retreat position, the position of holder 7, and the position of the opening 21 in the second process room 15 are positioned so as to overlap with the trajectory of the substrate holding part 4a in the case where the arm 4 of the transfer robot in the first process room 1 rotates about the rotation axis 4b.

As shown in FIG. 3A or FIG. 3B, a substrate 14 is located in the substrate mounting position in the second process room 15 and, for example, the substrate 14 is kept in a transferring state to the adjacent process room after completing the film formation process in the second process room 15. In this regard, it is shown in FIG. 3A to FIG. 12B that the substrate 14 is transferred from the second process room 15 to the first process room 1, however, in FIG. 3A or FIG. 3B, the position of the substrate 14 is located at the substrate transfer position seen from the arm 4 in the first process room 1.

Referring now to FIG. 3A or FIG. 3B, it will be sequentially described bellow about an operation of the arm 4 in the first process room 1 for transferring the substrate 14 in the second process room 15 and for mounting the substrate 14 at the substrate mounting position, and the operation of the arm 4 at the arm retreat position for retreating the arm 4 when the substrate 14 is being processed in the second process room 15.

In FIG. 3A or FIG. 3B, the arm 4 of the transfer robot in the first process room 1 is waiting at the arm retreat position in the first process room 1. That is, at this moment, the arm 4 for transferring the substrate 14 is disposed in the evacuation room 3 and the substrate 14 is mounted on the holder 7 in the adjacent second process room 15. Disabling the substrate lifting mechanism 8 (hereinafter, a protruding state of a pin for supporting the substrate on the holder 7 by operating the substrate lifting mechanism 8 is referred to as "UP" and an un-protruding state of the pin is referred to as "DOWN"), the gate valve 6 CLOSEs (hereinafter, "CLOSE" means the state in which the gate valve 6 blocks the openings 20, 21 between the first process room 1 and the second process room 15, and "OPEN" means the state in which the gate valve 6 does not block the openings 20, 21).

Figure 4A:
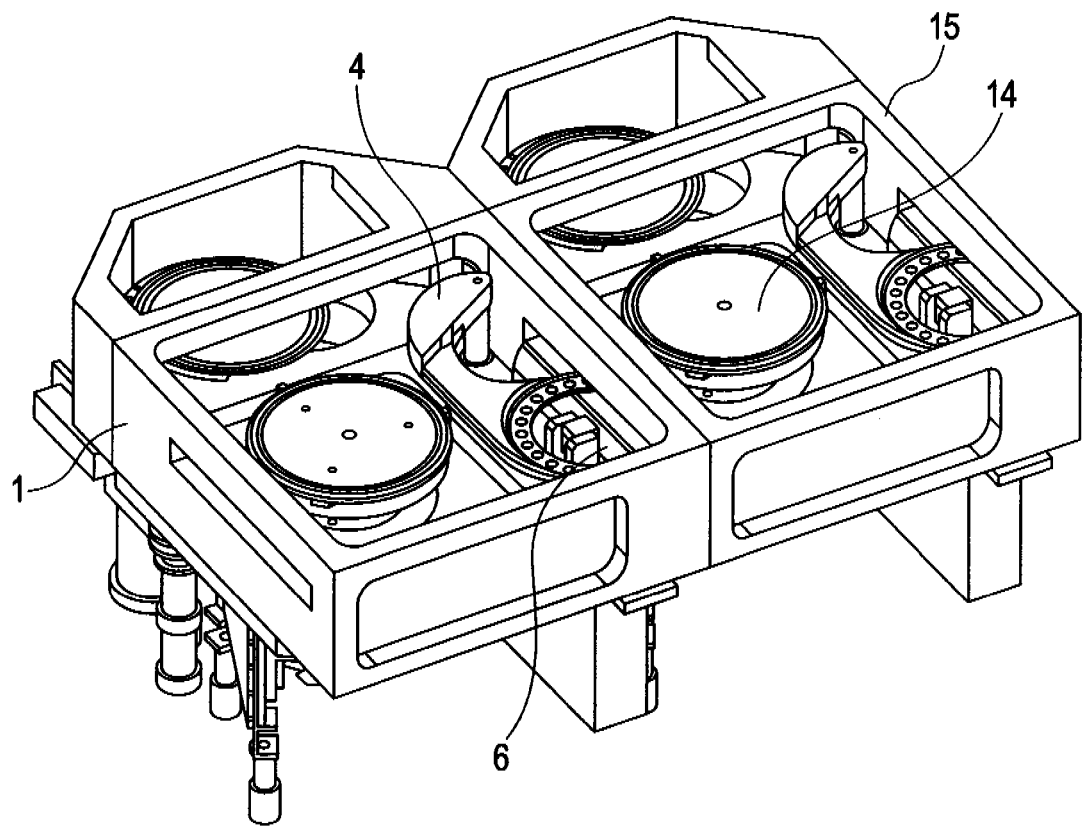
FIG. 4A is a schematic perspective view indicating the transferring state of the substrate by the substrate processing apparatus in an embodiment of the present invention.
Figure 4B:
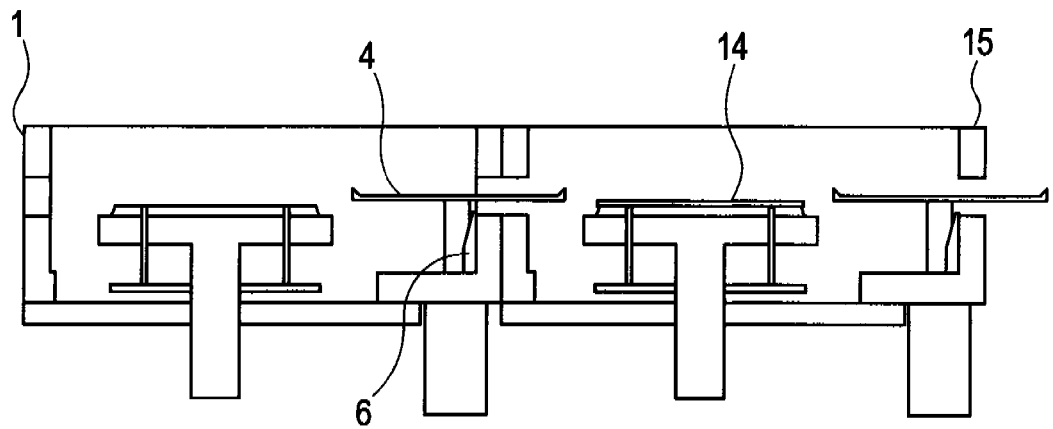
FIG. 4B is a schematic side view in FIG. 4A indicating the transferring state of the substrate by the substrate processing apparatus in an embodiment of the present invention.

FIG. 4A or FIG. 4B shows the process that the arm 4 of the transfer robot in the first process room 1 corresponding to the downstream process room moves from the arm retreat position and seeks to carry the substrate 14 out of the second process room 15 corresponding to the adjacent upstream process room. The gate valve 6 becomes the "OPEN" state and the arm 4 which was in the first process room 1 rotates up to the position where it passes the gate valve 6.

Figure 5A:
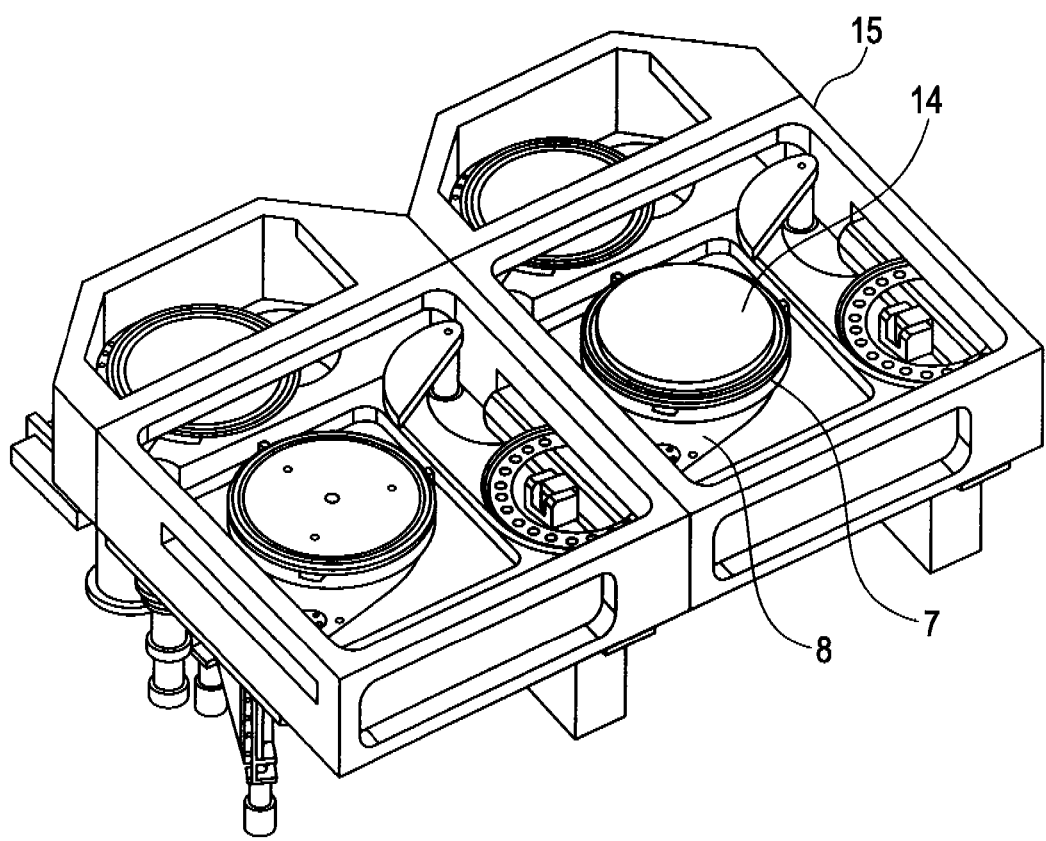
FIG. 5A is a schematic perspective view indicating the transferring state of the substrate by the substrate processing apparatus in an embodiment of the present invention.
Figure 5B:
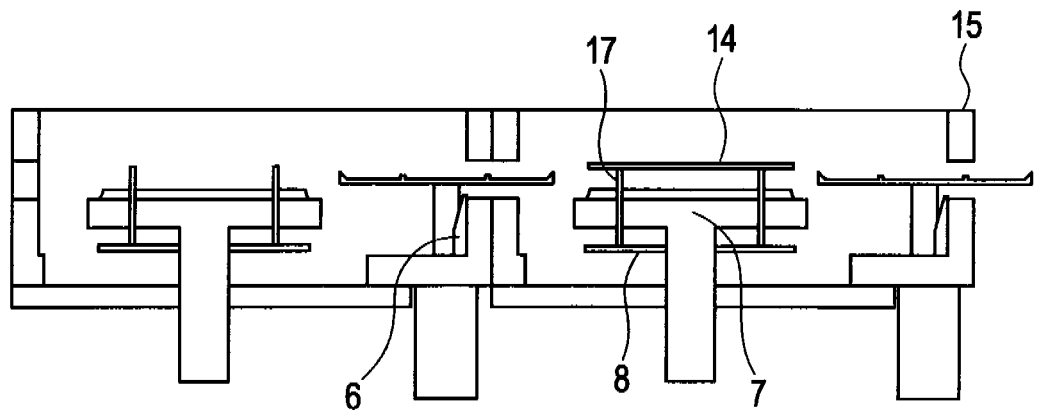
FIG. 5B is a schematic side view in FIG. 5A indicating the transferring state of the substrate by the substrate processing apparatus in an embodiment of the present invention.

FIG. 5A or FIG. 5B shows the state in which a pin 17 is kept the "UP" state by operating the substrate lifting mechanism 8 relative to the substrate 14 mounted on the holder 7 in the adjacent second process room 15.

Figure 6A:
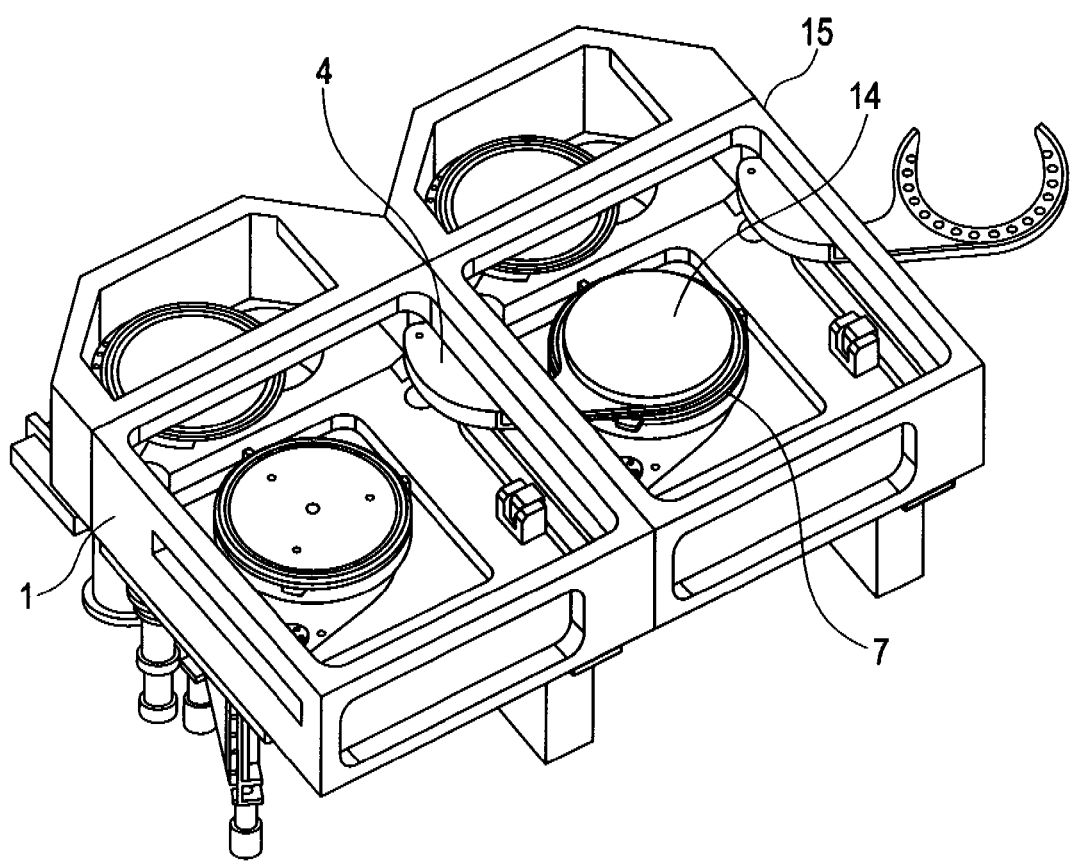
FIG. 6A is a schematic perspective view indicating the transferring state of a substrate by the substrate processing apparatus in an embodiment of the present invention.
Figure 6B:
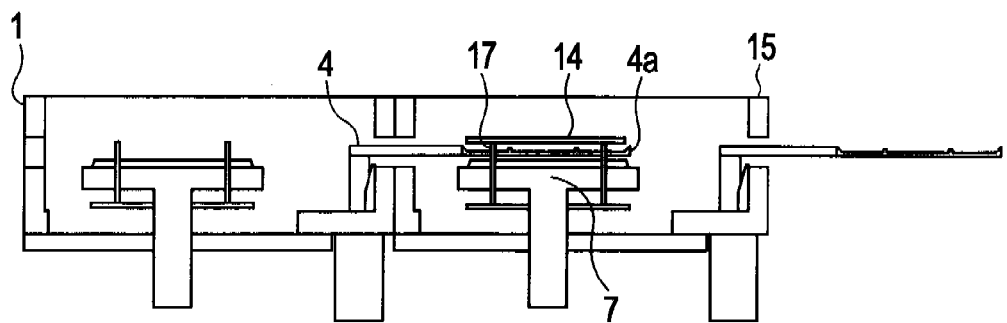
FIG. 6B is a schematic side view in FIG. 6A indicating the transferring state of the substrate by the substrate processing apparatus in an embodiment of the present invention.

FIG. 6A or FIG. 6B shows the state in which the substrate holding part 4a of the arm 4 of the transfer robot in the first process room 1 is rotated up to between the holder 7 of the adjacent second process room 15 and the substrate 14 supported by the pin 17. Here, the pin 17 supports the substrate 14 at three points and the substrate holding part 4a corresponding to the part of the arm 4 where the substrate 14 is mounted is U-shaped. Therefore, the substrate holding part 4a of the arm 4 of the transfer robot cannot collide even if the substrate holding part 4a rotates up to between the substrate 14 and the holder 7 due to the horizontal movement (by rotating) of the arm 4 of the transfer robot in the first process room 1 as shown in FIGS. 6A, 6B because the arm 4 can avoid clash with the three pins 17.

Figure 7A:
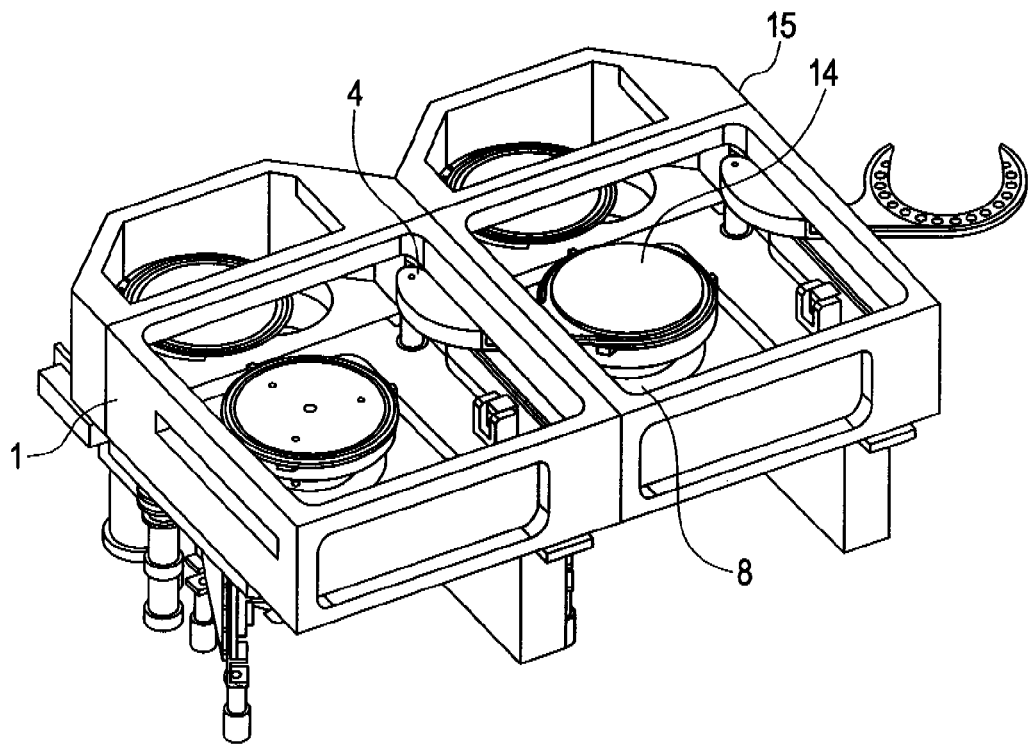
FIG. 7A is a schematic perspective view indicating the transferring state of the substrate by the substrate processing apparatus in an embodiment of the present invention.
Figure 7B:
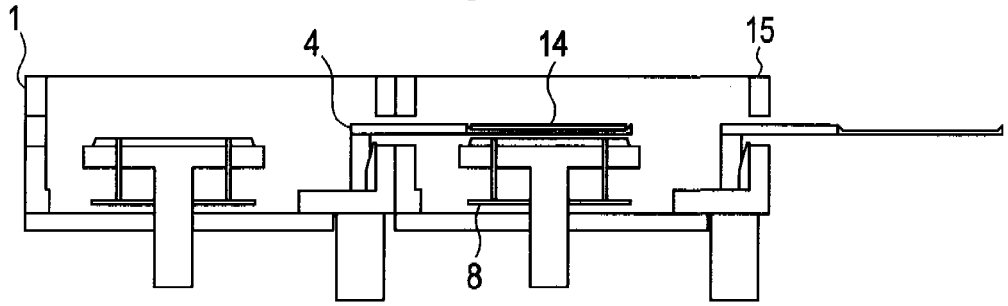
FIG. 7B is a schematic side view in FIG. 7A indicating the transferring state of the substrate by the substrate processing apparatus in an embodiment of the present invention.

FIG. 7A or FIG. 7B shows the state in which the substrate 14 is mounted on the substrate holding part 4a of the arm 4 of the transfer robot in the first process room 1 by operating the substrate lifting mechanism 8 in the adjacent second process room 15 and setting the pin 17 to the "DOWN" state.

Figure 8A:
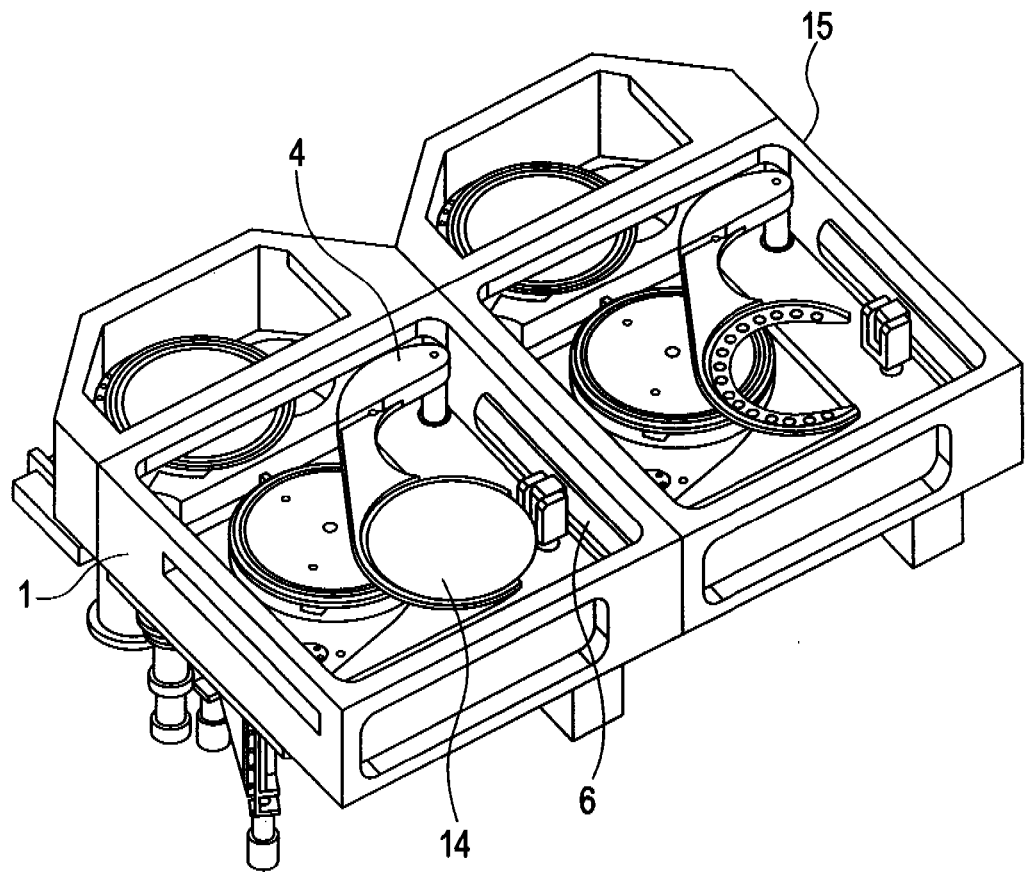
FIG. 8A is a schematic perspective view indicating the transferring state of the substrate by the substrate processing apparatus in an embodiment of the present invention.
Figure 8B:
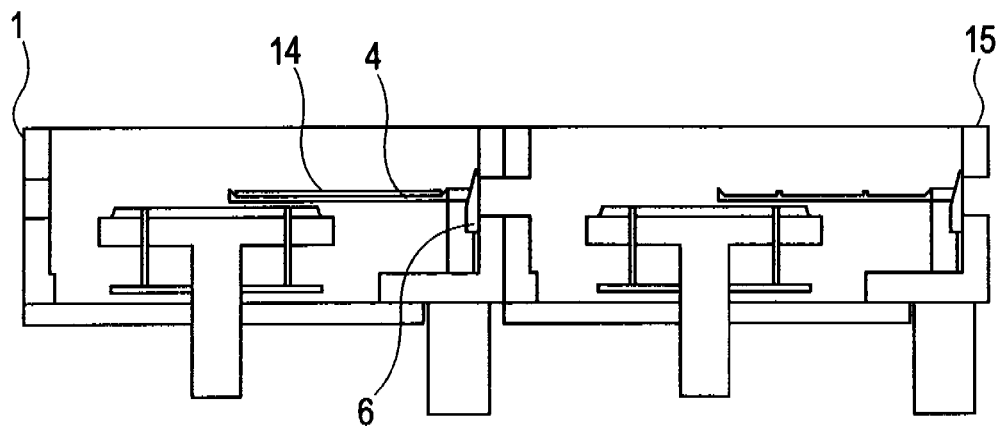
FIG. 8B is a schematic side view in FIG. 8A indicating the transferring state of the substrate by the substrate processing apparatus in an embodiment of the present invention.

FIG. 8A or FIG. 8B shows the process that the substrate 14 is transferred from the adjacent second process room 15 to the first process room 1. The gate valve 6 becomes the "CLOSE" state by rotating the arm 4 for transferring the substrate 14 up to the position shown in FIG. 8A or FIG. 8B. At that time, the arm 4 may be allowed to wait temporarily.

Figure 9A:
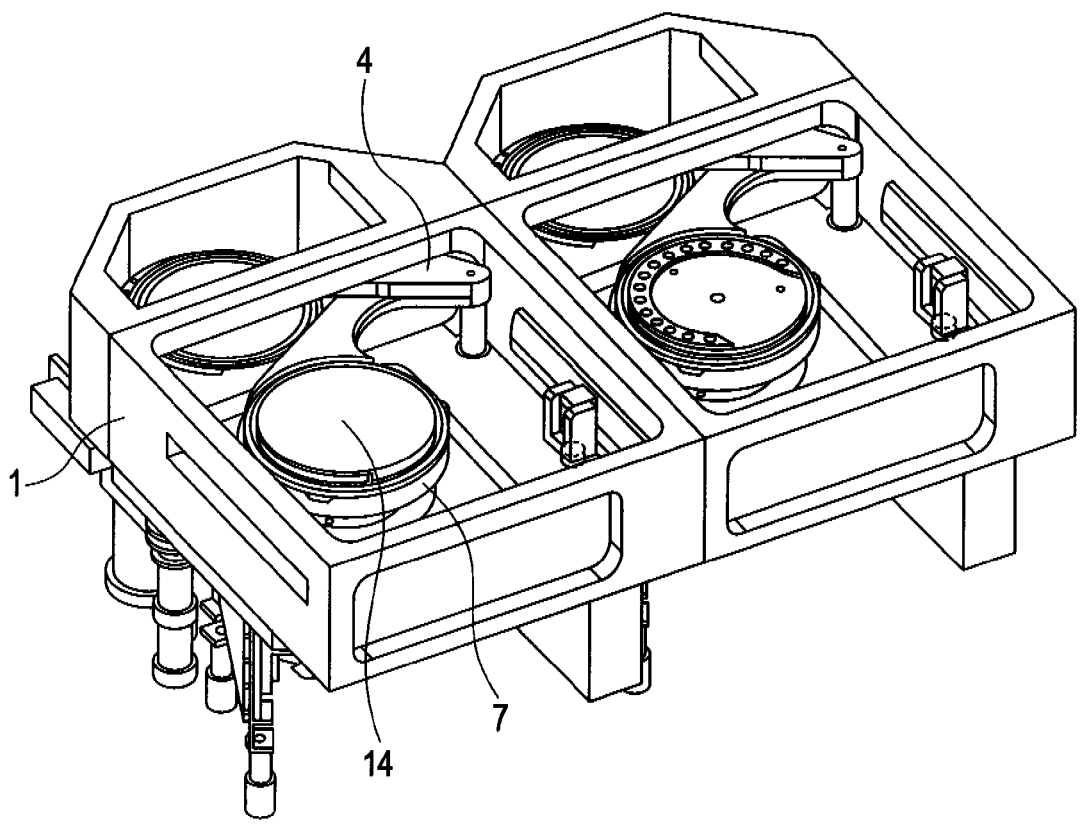
FIG. 9A is a schematic perspective view indicating the transferring state of the substrate by the substrate processing apparatus in an embodiment of the present invention.
Figure 9B:
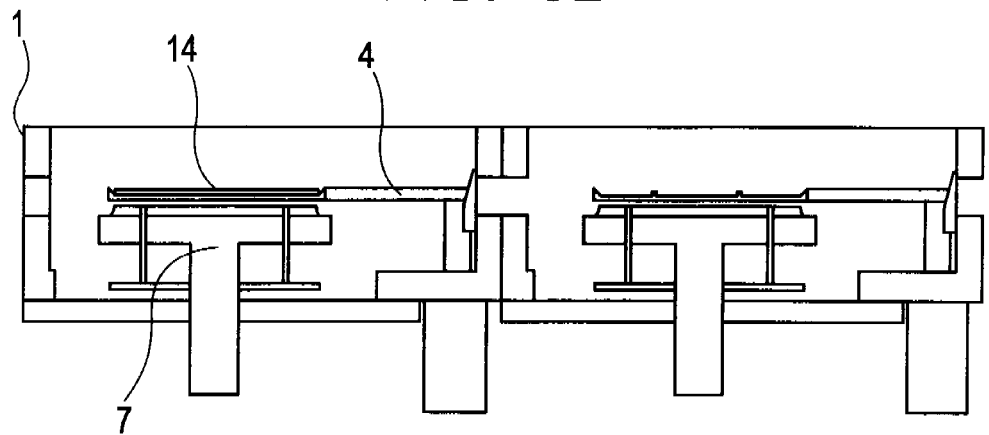
FIG. 9B is a schematic side view in FIG. 9A indicating the transferring state of the substrate by the substrate processing apparatus in an embodiment of the present invention.

FIG. 9A or FIG. 9B shows the state that the arm 4 for transferring the substrate 14 rotates up to on the holder 7, i.e. the substrate mounting position, in the first process room 1 and stops.

Figure 10A:
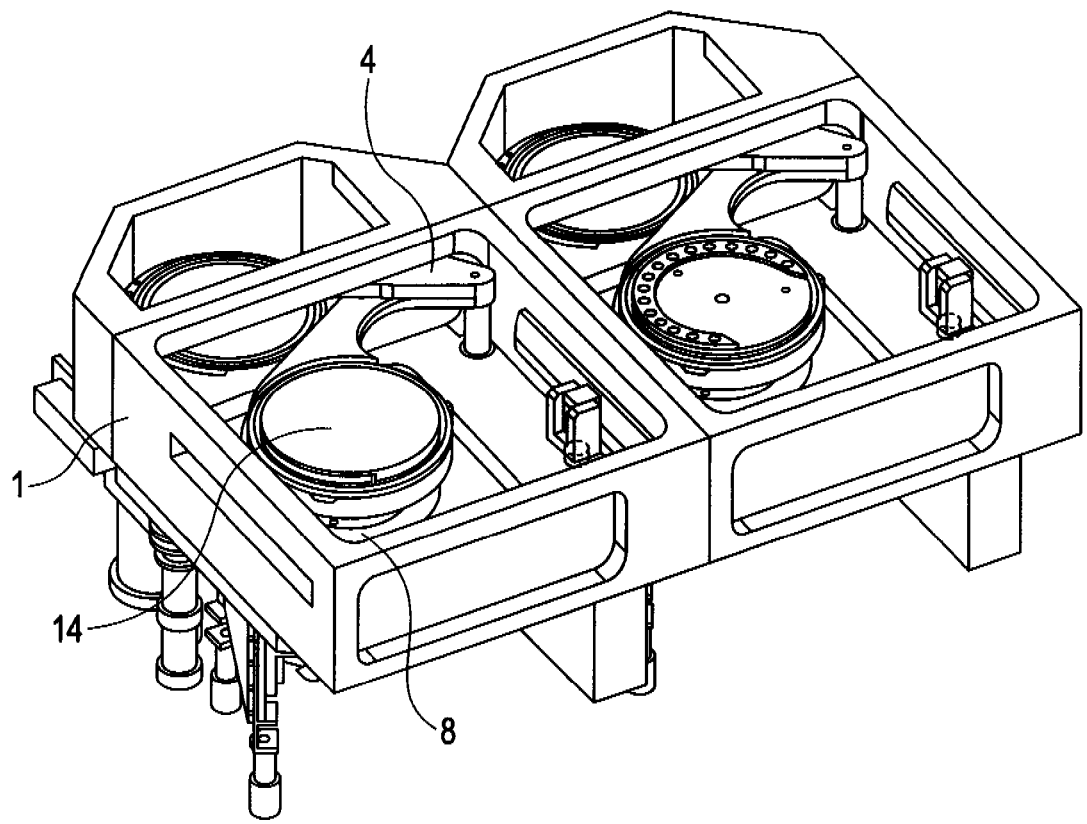
FIG. 10A is a schematic perspective view indicating the transferring state of the substrate by the substrate processing apparatus in an embodiment of the present invention.
Figure 10B:
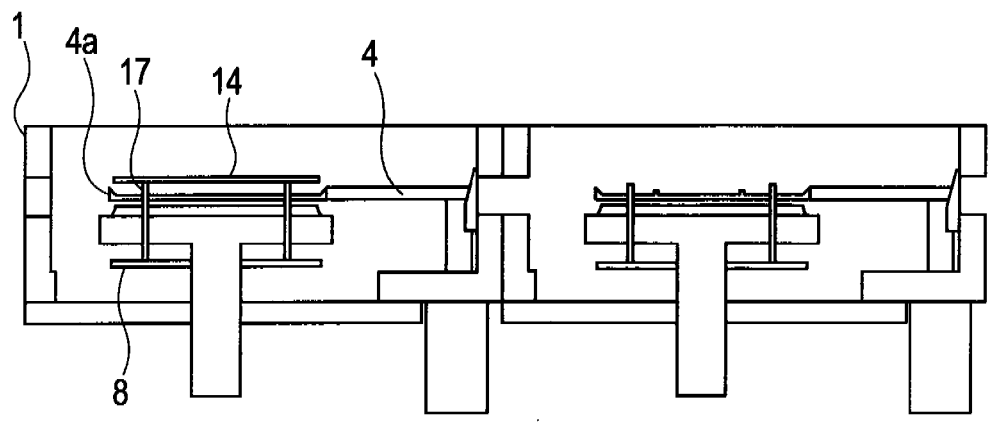
FIG. 10B is a schematic side view in FIG. 10A indicating the transferring state of the substrate by the substrate processing apparatus in an embodiment of the present invention.

FIG. 10A or FIG. 10B shows the state in which the pin 17 makes contact with the substrate 14 on the substrate holding part 4a of the arm 4 of the transfer robot in the first process room 1 with lifting the pin 17 "UP" state by the substrate lifting mechanism 8 in the first process room 1.

Figure 11A:
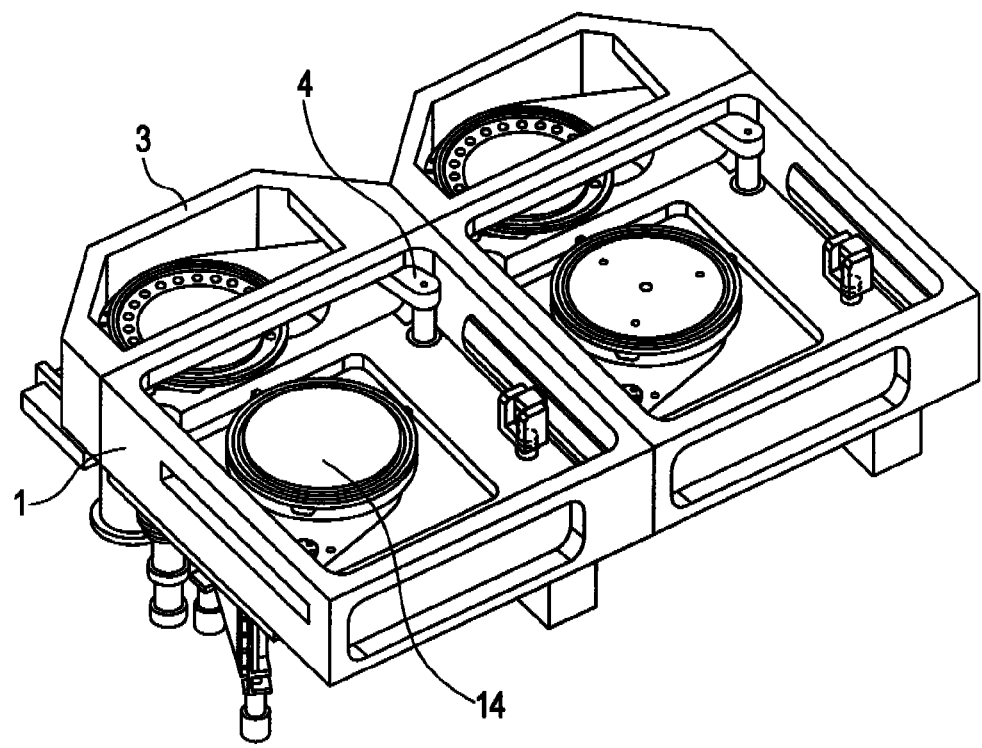
FIG. 11A is a schematic perspective view indicating the transferring state of the substrate by the substrate processing apparatus in an embodiment of the present invention.
Figure 11B:
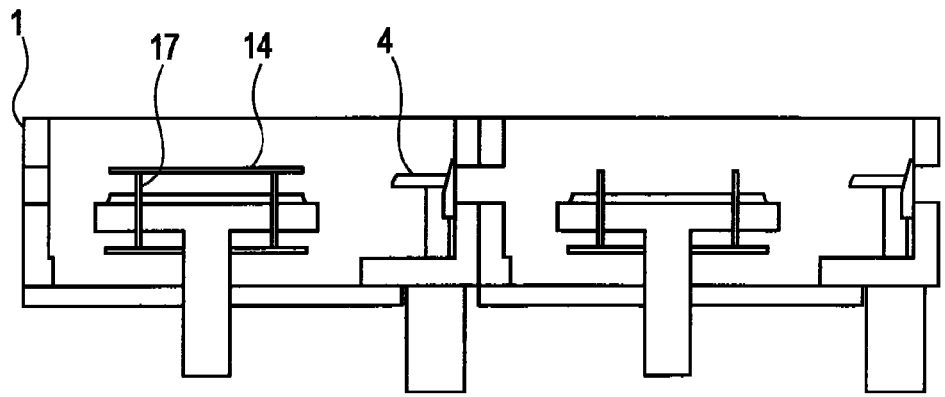
FIG. 11B is a schematic side view in FIG. 11A indicating the transferring state of the substrate by the substrate processing apparatus in an embodiment of the present invention.

FIG. 11A or FIG. 11B shows the state in which the arm 4 of the transfer robot in the first process room 1 is rotated up to the evacuation room 3 and is disposed at the arm retreat position and the substrate 14 is supported by the pin 17. That is, the drive part 16 rotates the arm 4 so that the arm in the first process room is housed in the evacuation room 3 corresponding to the arm retreat position.

Figure 12A:
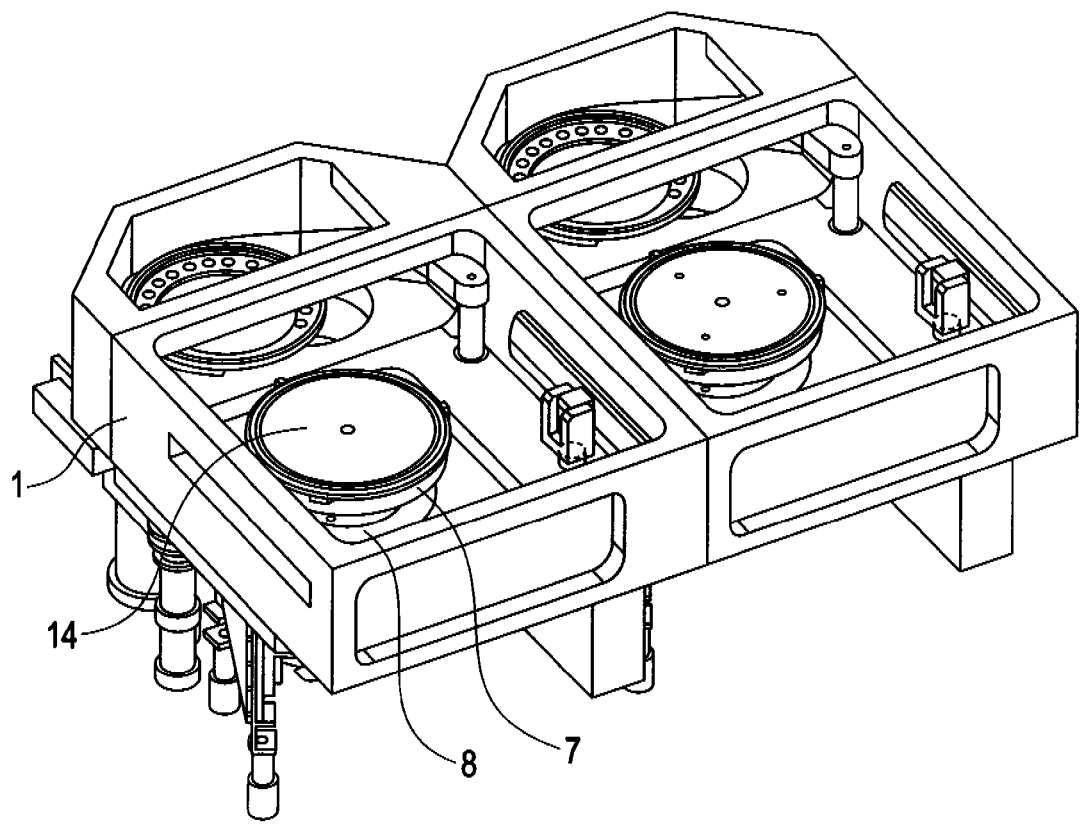
FIG. 12A is a schematic perspective view indicating the transferring state of the substrate by the substrate processing apparatus in an embodiment of the present invention.
Figure 12B:
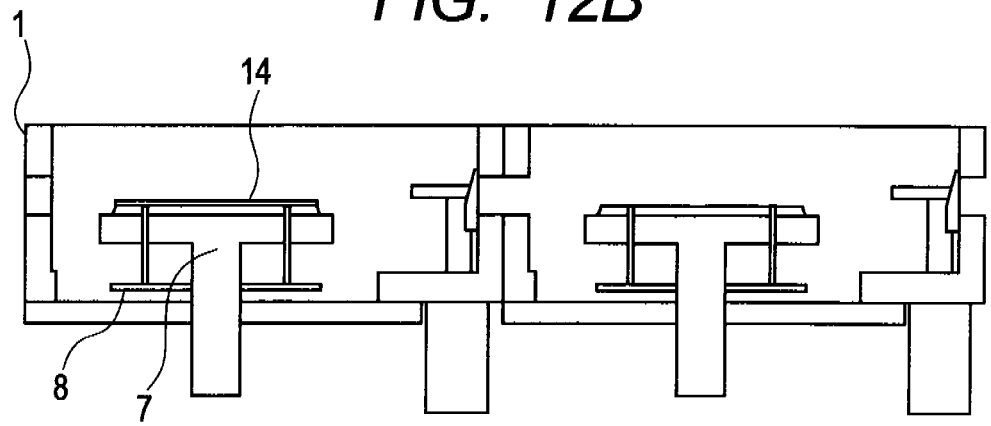
FIG. 12B is a schematic side view in FIG. 12A indicating the transferring state of the substrate by the substrate processing apparatus in an embodiment of the present invention.

FIG. 12A or FIG. 12B shows the state in which the substrate 14 is mounted on the holder 7 at the substrate mounting position in the first process room 1 by operating the substrate lifting mechanism 8 in the first process room 1 and setting the pin 17 to the "DOWN" state. After that, for example, the film formation process is started in the first process room 1.

In the present embodiment, in the case where the film formation process is performed on the substrate 14 mounted on the holder 7 in the first process room 1, the arm 4 of the transfer robot is disposed in the evacuation room 3. Therefore, the affect of the film peeling of the film formed on the substrate 14 may become less susceptible regarding the arm 4 of the transfer robot.

Figure 13:
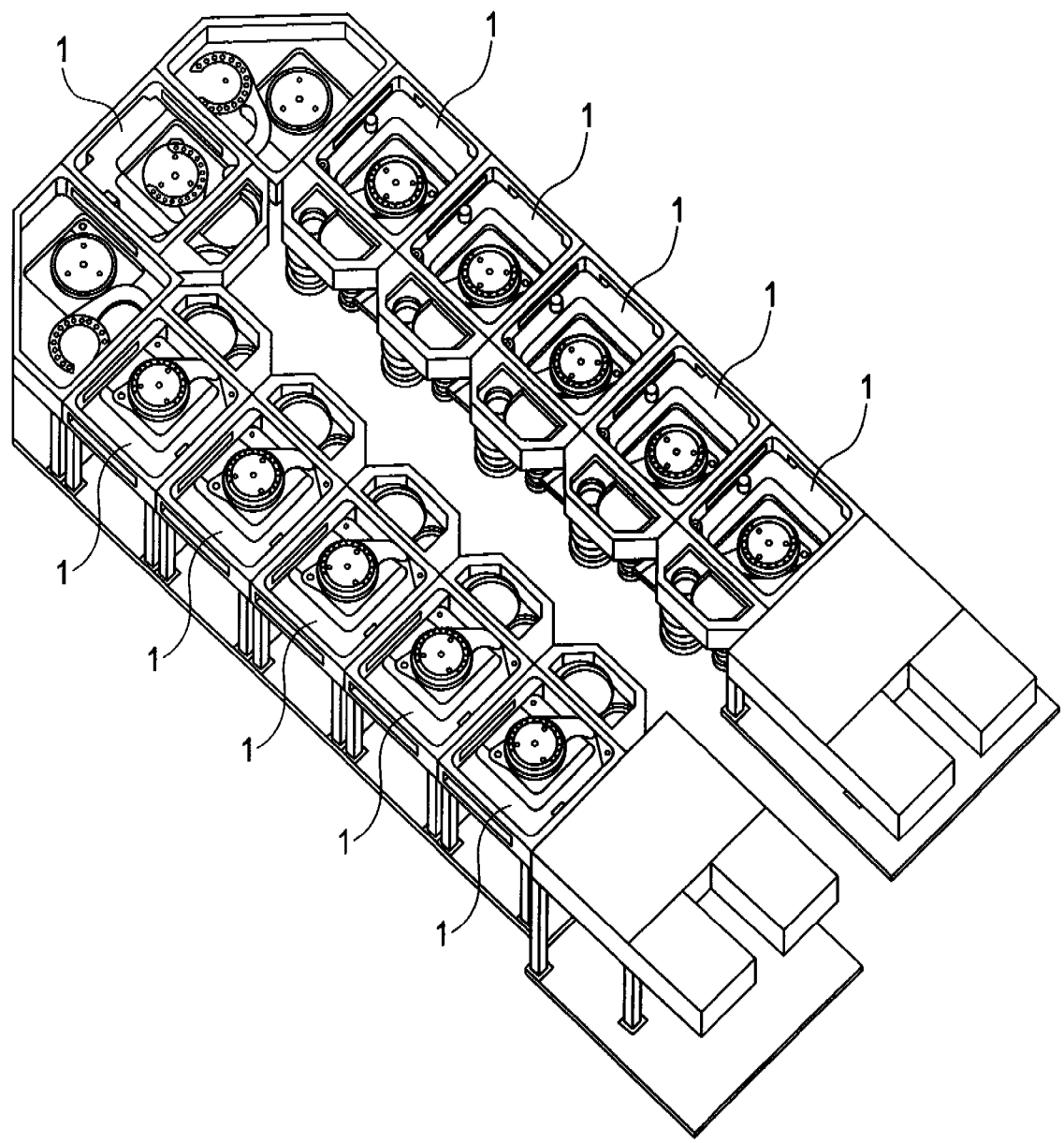
FIG. 13 is a schematic perspective view of a configuration of another embodiment of the present invention.
Figure 14:
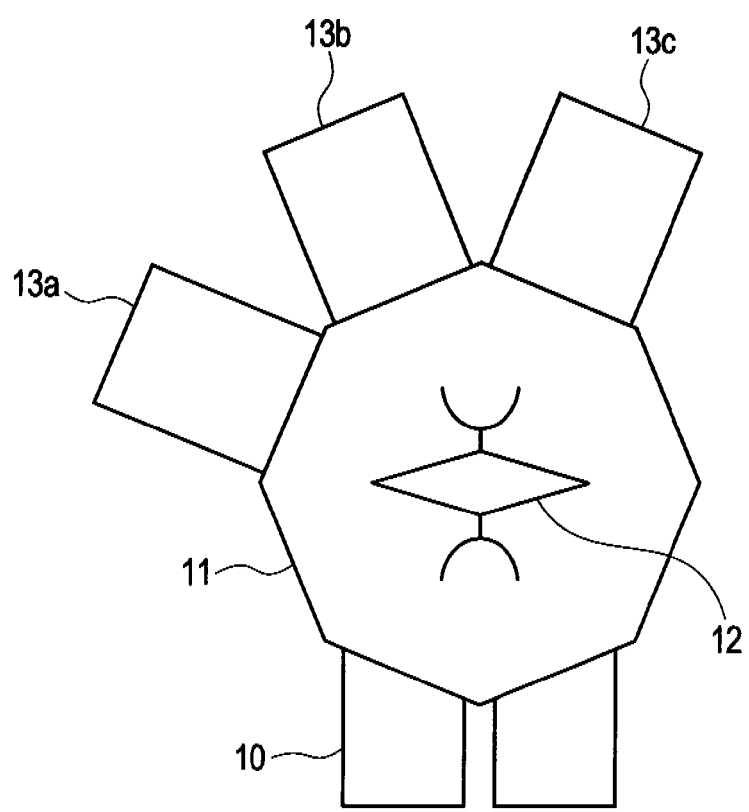
FIG. 14 is a schematic view of a conventional cluster tool type multi-chamber substrate processing apparatus.

FIG. 13 shows the substrate processing apparatus 2 in accordance with another embodiment of the present invention. The substrate processing apparatus 2 includes a group of 11 process rooms 1 in tandem placement and substrates are sequentially transferred through each of the process rooms to be processed.

The invention claimed is:

1. A substrate processing apparatus comprising:
   a first chamber in which a substrate is processed;
   a second chamber, in which the substrate is processed, that is connected to the first chamber by a gate valve and has an opening through which the substrate is transferred between the first chamber and the second chamber;

a third chamber that is connected to the second chamber by a second gate valve and has a second opening through which the substrate is transferred between the second chamber and the third chamber;

a first holder that is provided in the first chamber, and on which the substrate is mounted when thin film deposition is performed on the substrate;

a second holder that is provided in the second chamber, and on which the substrate is mounted when thin film deposition is performed on the substrate;

a third holder which is provided in the third chamber, and on which the substrate is mounted;

an arm that is jointless, is provided in the first chamber, and has a substrate holding part capable of holding the substrate, the arm being configured to rotate on a single rotation axis fixed in the first chamber and being configured to move, by rotating on the single rotation axis, the substrate holding part through the gate valve on any of the first holder, the second holder, and an arm retreat position for retreating the substrate holding part when thin film deposition is performed on the substrate mounted on the first holder; and a second arm that is jointless, is provided in the second chamber, and has a second substrate holding part capable of holding the substrate, the arm being configured to rotate on a second single rotation axis fixed in the second chamber and being configured to move, by rotating on the second single rotation axis, the second substrate holding part through the second gate valve on any of the second holder and the third holder, wherein the arm retreat position, the first holder and the second holder are sequentially located on a concentric circle having a center at the single rotation axis, wherein the second arm is configured to transfer the substrate mounted on the third holder to the second holder through the second gate valve, and the arm is configured to transfer the substrate mounted on the second holder to the first holder through the gate valve, and wherein the second arm is further configured to move the second substrate holding part on a second arm retreat position for retreating the second substrate holding part when thin film deposition is performed on the substrate mounted on the second holder.

2. The substrate processing apparatus according to claim 1, wherein the arm retreat position is located in an evacuation chamber with a vacuum evacuation port that is in communication with the first chamber.

3. The substrate processing apparatus according to claim 1, wherein the second arm retreat position is located in an evacuation chamber with a vacuum evacuation port that is in communication with the second chamber.

* * * * *